US011535747B2

(12) United States Patent
Hungerland et al.

(10) Patent No.: US 11,535,747 B2
(45) Date of Patent: Dec. 27, 2022

(54) TALC-FILLED POLYCARBONATE COMPOSITIONS

(71) Applicant: Covestro Deutschland AG, Leverkusen (DE)

(72) Inventors: Tim Hungerland, Cologne (DE); Tanja Cassel, Duisburg (DE)

(73) Assignee: Covestro Deutschland AG, Leverkusen (DE)

( * ) Notice: Subject to any disclaimer, the term of this patent is extended or adjusted under 35 U.S.C. 154(b) by 190 days.

(21) Appl. No.: 16/956,719

(22) PCT Filed: Dec. 12, 2018

(86) PCT No.: PCT/EP2018/084599
§ 371 (c)(1),
(2) Date: Jun. 22, 2020

(87) PCT Pub. No.: WO2019/121253
PCT Pub. Date: Jun. 27, 2019

(65) Prior Publication Data
US 2021/0371648 A1 Dec. 2, 2021

(30) Foreign Application Priority Data
Dec. 20, 2017 (EP) .................................... 17208726

(51) Int. Cl.
C08L 69/00 (2006.01)
C08L 33/24 (2006.01)
C08L 33/12 (2006.01)
C08K 3/34 (2006.01)
C08F 220/14 (2006.01)
C08F 220/56 (2006.01)
H05K 7/20 (2006.01)
H05K 5/02 (2006.01)

(52) U.S. Cl.
CPC ............ *C08L 69/00* (2013.01); *C08F 220/14* (2013.01); *C08F 220/56* (2013.01); *C08K 3/34* (2013.01); *C08L 33/12* (2013.01); *C08L 33/24* (2013.01); *H05K 7/20481* (2013.01); *C08F 2800/20* (2013.01); *C08L 2203/20* (2013.01); *H05K 5/02* (2013.01); *H05K 7/2039* (2013.01)

(58) Field of Classification Search
None
See application file for complete search history.

(56) References Cited

U.S. PATENT DOCUMENTS

| 2,991,273 A | 7/1961 | Wilhelm et al. |
| 2,999,835 A | 9/1961 | Goldberg |
| 2,999,846 A | 9/1961 | Hermann et al. |
| 3,148,172 A | 9/1964 | Fox |
| 3,271,367 A | 9/1966 | Hermann et al. |
| 4,034,016 A * | 7/1977 | Baron ..................... C08L 75/04 525/454 |
| 4,982,014 A | 1/1991 | Freitag et al. |
| 5,004,777 A * | 4/1991 | Hallden-Abberton ...................... C08L 33/24 524/508 |
| 5,097,002 A | 3/1992 | Sakashita et al. |
| 5,340,905 A | 8/1994 | Kuehling et al. |
| 5,717,057 A | 2/1998 | Sakashita et al. |
| 2006/0287422 A1* | 12/2006 | Volkers ................... C08L 69/00 524/611 |

FOREIGN PATENT DOCUMENTS

| DE | 1570703 A1 | 2/1970 |
| DE | 2063050 A1 | 7/1972 |
| DE | 2211956 A1 | 10/1973 |
| DE | 3832396 A1 | 2/1990 |
| DE | 10006208 A1 | 8/2001 |
| DE | 10022037 A1 | 11/2001 |
| EP | 0332454 A2 | 9/1989 |
| EP | 0500496 A1 | 8/1992 |
| EP | 0839623 A1 | 5/1998 |
| EP | 1559743 A1 | 8/2005 |
| EP | 1865027 A1 | 12/2007 |
| FR | 1561518 A | 3/1969 |
| GB | 1122003 A | 7/1968 |
| GB | 1341318 A | 12/1973 |
| JP | 03021664 * | 1/1991 |
| WO | 96/15102 A2 | 5/1996 |
| WO | 01/05866 A1 | 1/2001 |
| WO | 2004/063249 A1 | 7/2004 |
| WO | 2010/108626 A1 | 9/2010 |
| WO | 2014/188609 A1 | 11/2014 |
| WO | 2015/052106 A2 | 4/2015 |
| WO | 2016/087477 A1 | 6/2016 |

OTHER PUBLICATIONS

International Preliminary Report on Patentability received for PCT Patent Application No. PCT/EP2018/084599, dated Jul. 2, 2020, 12 pages (7 pages of English Translation and 5 p[ages of Original Document).
International Search Report and Written Opinion received for PCT Patent Application No. PCT/EP2018/084599, dated Feb. 28, 2019, 14 pages (6 pages of English Translation and 8 pages of Original Document).

* cited by examiner

Primary Examiner — David J Buttner
(74) Attorney, Agent, or Firm — The Webb Law Firm

(57) ABSTRACT

The invention relates to the use of PMMI copolymers for reducing the decrease in molecular weight of the polymer induced by addition of talc in compositions based on aromatic polycarbonate. At the same time, the mechanical, optical and rheological properties of the thermoplastic composition, in spite of the addition of the PMMI copolymer, remain good and are in some cases even improved.

10 Claims, No Drawings

TALC-FILLED POLYCARBONATE COMPOSITIONS

CROSS-REFERENCE TO RELATED APPLICATIONS

This application is a national stage application (under 35 U.S.C. § 371) of PCT/EP2018/084599, filed Dec. 12, 2018, which claims benefit of European Application No. 17208726.4, filed Dec. 20, 2017, both of which are incorporated herein by reference in their entirety.

The present invention relates to the stabilization of aromatic polycarbonate in talc-containing polycarbonate compositions against decreasing molecular weight with a simultaneously minimum effect on heat distortion resistance and correspondingly to the use of a novel additive for this purpose, and to corresponding compositions comprising aromatic polycarbonate and talc, and hence also to a method of preventing or reducing polycarbonate degradation resulting from the addition of talc. The invention also relates to mouldings made from these compositions.

The production of filled polycarbonate compositions by compounding under standard processing conditions, according to the filler, leads to a decrease in molecular weight of the polycarbonate. This effect is particularly highly marked in the case of talc-containing compositions since this filler bears a very high number of reactive groups, for instance basic hydroxyl groups, at the surface.

The decrease in molecular weight in turn has an adverse effect on the optical, rheological, mechanical and thermal properties of the polycarbonate compositions. It is therefore necessary to add process stabilizers to the compositions, which inhibit the degradation of the polymer chains, the decrease in molecular weight.

Conventional process stabilizers such as phosphites or phosphonites have been found to be unsuitable for inhibiting the filler-induced degradation. In filled thermoplastics, it is possible to use, inter alia, oxidized, acid-modified polyolefinic (co)polymers, for example HiWax from Mitsui Chemicals, or A-C products from Honeywell. WO 2016/087477 A1 describes the use of oxidized polyethylene waxes in polycarbonate and the effect thereof on heat distortion resistance among other properties. Even small amounts of these additives, owing to their low melting points, can lower the thermal and mechanical properties. According to the filler content, stabilization of filled polycarbonate compositions requires wax concentrations >1% by weight. At higher concentrations, however, such additives have a plasticizing effect and hence reduce the strengthening effect of the filler and hence its primary purpose. In addition, the miscibility of these olefinic waxes with polycarbonate decreases rapidly with rising content, which leads to significant turbidity of the compounds. Moreover, in the case of addition of fillers, this also has an adverse effect on colourability and leads to delamination effects at the surface of the materials. Furthermore, such waxes are unstable under prolonged thermal stress, which leads to more rapid yellowing of the material.

The problem addressed was therefore that of identifying suitable novel stabilizers that inhibit any decrease in molecular weight in aromatic polycarbonate in talc-filled polycarbonate compositions and do not have any adverse effect on the actual strengthening effect of the filler, and of providing corresponding compositions. At the same time, there was to be a minimum effect, and at best no adverse effect at all, on the thermal, optical and rheological properties of the polycarbonate compositions as compared with compositions lacking the novel stabilizer.

This problem is surprisingly solved by the addition of PMMI copolymer to the polycarbonate compositions. The addition of the PMMI copolymer does not significantly worsen the heat distortion resistance and the mechanical and rheological properties of the polycarbonate compositions, but actually improves them in some cases.

The invention thus provides for the use of PMMI copolymers for inhibition, i.e. at least reduction, preferably prevention, of the decrease in molecular weight of aromatic polycarbonate in talc-filled polycarbonate compositions on compounding, especially also on compounding by means of co-kneaders.

Compounding is the addition of admixtures, especially of fillers and additives, to the polymer, here to the aromatic polycarbonate. This is typically accomplished by means of an extruder and at temperatures in the extruder above 260° C.

The invention therefore also provides a composition comprising

A) aromatic polycarbonate,
B) talc,
C) PMMI copolymer and
D) optionally further additives.

The individual components are described in detail hereinafter.

Component A

Component A of the composition is aromatic polycarbonates.

Aromatic polycarbonates in the context of the present invention include not only homopolycarbonates but also copolycarbonates and/or polyestercarbonates; the polycarbonates may be linear or branched in a known manner. According to the invention, mixtures of polycarbonates may also be used.

The thermoplastic polycarbonates, including the thermoplastic aromatic polyestercarbonates, preferably have weight-average molecular weights $M_w$ of 15 000 to 40 000 g/mol, more preferably to 34 000 g/mol, especially preferably of 17 000 to 33 000 g/mol, in particular of 19 000 to 32 000 g/mol, determined by gel permeation chromatography, calibrated against bisphenol A polycarbonate standards using dichloromethane as eluent, calibration with linear polycarbonates (formed from bisphenol A and phosgene) of known molar mass distribution from PSS Polymer Standards Service GmbH, Germany, and calibration by method 2301-0257502-09D (2009 German-language edition) from Currenta GmbH & Co. OHG, Leverkusen. The eluent is dichloromethane. Column combination of crosslinked styrene-divinylbenzene resins. Diameter of analytical columns: 7.5 mm; length: 300 mm. Particle sizes of column material:

3 µm to 20 µm. Concentration of solutions: 0.2% by weight. Flow rate: 1.0 ml/min, temperature of solutions: 30° C. Use of UV and/or RI detection.

A portion, up to 80 mol %, preferably from 20 mol % to 50 mol %, of the carbonate groups in the polycarbonates used in accordance with the invention may have been replaced by aromatic dicarboxylic ester groups. Polycarbonates of this kind that incorporate both acid radicals from the carbonic acid and acid radicals from aromatic dicarboxylic acids into the molecular chain are referred to as aromatic polyester carbonates. In the context of the present invention, they are covered by the umbrella term of thermoplastic aromatic polycarbonates.

The polycarbonates are prepared in a known manner from dihydroxyaryl compounds, carbonic acid derivatives, optionally chain terminators and optionally branching agents, and the polyestercarbonates are prepared by replacing a portion of the carbonic acid derivatives with aromatic dicarboxylic acids or derivatives of the dicarboxylic acids, to a degree according to the extent to which carbonate structural units in the aromatic polycarbonates are to be replaced by aromatic dicarboxylic ester structural units.

Dihydroxyaryl compounds suitable for the preparation of polycarbonates are those of the formula (1)

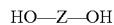
$$HO-Z-OH \quad (1)$$

in which

Z is an aromatic radical which has 6 to 30 carbon atoms and may contain one or more aromatic rings, may be substituted and may contain aliphatic or cycloaliphatic radicals or alkylaryls or heteroatoms as bridging elements.

Preferably, Z in formula (1) is a radical of the formula (2)

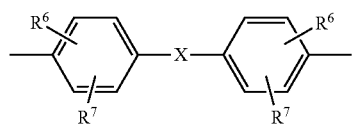

in which $R^6$ and $R^7$ are independently H, $C_1$- to $C_{18}$-alkyl, $C_1$- to $C_{18}$-alkoxy, halogen such as Cl or Br or in each case optionally substituted aryl or aralkyl, preferably H or $C_1$- to $C_{12}$-alkyl, more preferably H or $C_1$- to $C_8$-alkyl and most preferably H or methyl, and X is a single bond, —$SO_2$—, —CO—, —O—, —S—, $C_1$- to $C_6$-alkylene, $C_2$- to $C_5$-alkylidene or $C_5$- to $C_6$-cycloalkylidene which may be substituted by $C_1$- to $C_6$-alkyl, preferably methyl or ethyl, and also $C_6$- to $C_{12}$-arylene which may optionally be fused to aromatic rings containing further heteroatoms.

Preferably, X is a single bond, $C_1$- to $C_5$-alkylene, $C_2$- to $C_5$-alkylidene, $C_5$- to $C_6$-cycloalkylidene, —O—, —SO—, —CO—, —S—, —$SO_2$— or a radical of the formula (3)

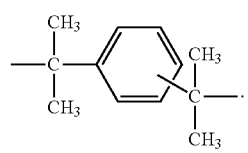

Examples of dihydroxyaryl compounds (diphenols) are: dihydroxybenzenes, dihydroxydiphenyls, bis(hydroxyphenyl)alkanes, bis(hydroxyphenyl)cycloalkanes, bis(hydroxyphenyl)aryls, bis(hydroxyphenyl) ethers, bis(hydroxyphenyl) ketones, bis(hydroxyphenyl) sulfides, bis (hydroxyphenyl) sulfones, bis(hydroxyphenyl) sulfoxides, 1,1'-bis(hydroxyphenyl)diisopropylbenzenes and the ring-alkylated and ring-halogenated compounds thereof.

Examples of dihydroxyaryl compounds suitable for the preparation of the polycarbonates and copolycarbonates to be used in accordance with the invention include hydroquinone, resorcinol, dihydroxydiphenyl, bis(hydroxyphenyl)alkanes, bis(hydroxyphenyl)cycloalkanes, bis(hydroxyphenyl) sulfides, bis(hydroxyphenyl) ethers, bis (hydroxyphenyl) ketones, bis(hydroxyphenyl) sulfones, bis (hydroxyphenyl) sulfoxides, α,α'-bis(hydroxyphenyl) diisopropylbenzenes, and the alkylated, ring-alkylated and ring-halogenated compounds thereof. Preparation of copolycarbonates can also be accomplished using Si-containing telechelics, so as to obtain what are called Si copolycarbonates.

Preferred dihydroxyaryl compounds are 4,4'-dihydroxydiphenyl, 2,2-bis(4-hydroxyphenyl)-1-phenylpropane, 1,1-bis(4-hydroxyphenyl)phenylethane, 2,2-bis(4-hydroxyphenyl)propane, 2,4-bis(4-hydroxyphenyl)-2-methylbutane, 1,3-bis[2-(4-hydroxyphenyl)-2-propyl]benzene (bisphenol M), 2,2-bis(3-methyl-4-hydroxyphenyl)propane, bis(3,5-dimethyl-4-hydroxyphenyl)methane, 2,2-bis(3,5-dimethyl-4-hydroxyphenyl)propane, bis(3,5-dimethyl-4-hydroxyphenyl) sulfone, 2,4-bis(3,5-dimethyl-4-hydroxyphenyl)-2-methylbutane, 1,3-bis[2-(3,5-dimethyl-4-hydroxyphenyl)-2-propyl]benzene and 1,1-bis(4-hydroxyphenyl)-3,3,5-trimethylcyclohexane (bisphenol TMC), and also the bisphenols of the formulae (I) to (III)

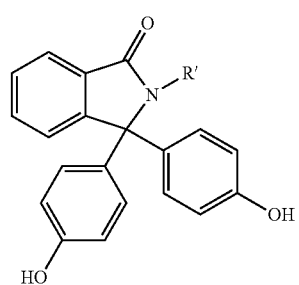

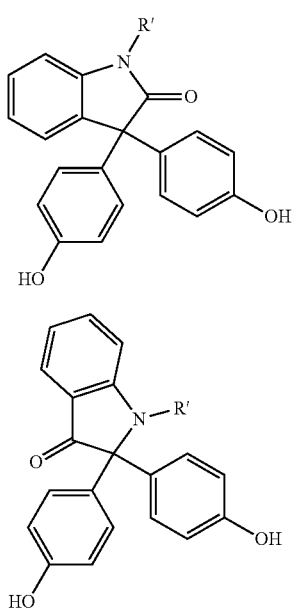

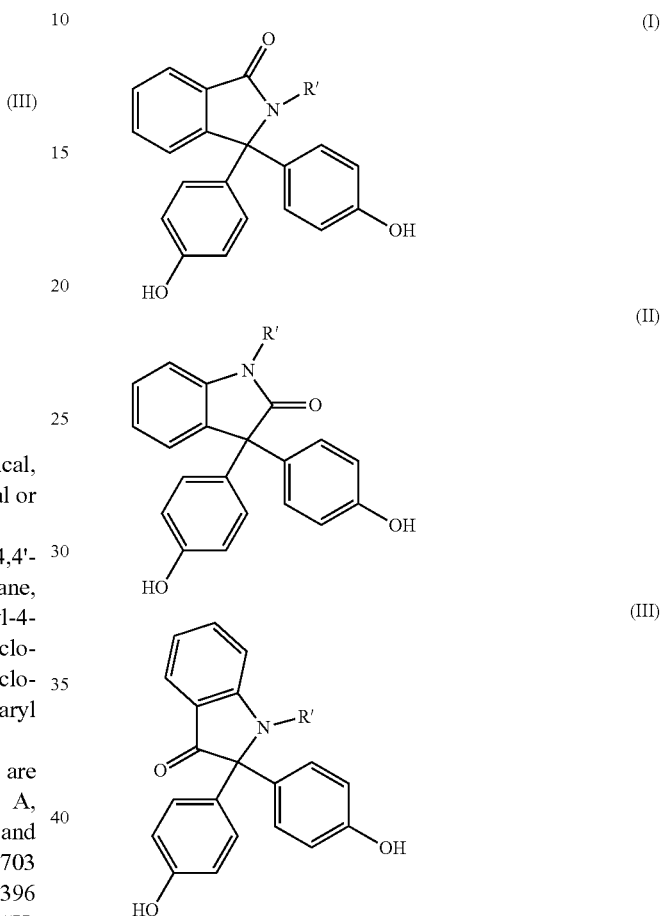

in which R' in each case is a $C_1$- to $C_4$-alkyl radical, aralkyl radical or aryl radical, preferably a methyl radical or phenyl radical, most preferably a methyl radical.

Particularly preferred dihydroxyaryl compounds are 4,4'-dihydroxydiphenyl, 1,1-bis(4-hydroxyphenyl)phenylethane, 2,2-bis(4-hydroxyphenyl)propane, 2,2-bis(3,5-dimethyl-4-hydroxyphenyl)propane, 1,1-bis(4-hydroxyphenyl)cyclohexane and 1,1-bis(4-hydroxyphenyl)-3,3,5-trimethylcyclohexane (bisphenol TMC), and also the dihydroxyaryl compounds of the formulae (I), (II) and/or (III).

These and further suitable dihydroxyaryl compounds are described, for example, in U.S. Pat. Nos. 2,999,835 A, 3,148,172 A, 2,991,273 A, 3,271,367 A, 4,982,014 A and 2,999,846 A, in German published specifications 1 570 703 A, 2 063 050 A, 2 036 052 A, 2 211 956 A and 3 832 396 A, in French patent 1 561 518 A1, in the monograph "H. Schnell, Chemistry and Physics of Polycarbonates, Interscience Publishers, New York 1964, p. 28 ff.; p. 102 ff.", and in "D. G. Legrand, J. T. Bendler, Handbook of Polycarbonate Science and Technology, Marcel Dekker New York 2000, p. 72ff.".

In the case of the homopolycarbonates, only one dihydroxyaryl compound is used; in the case of copolycarbonates, two or more dihydroxyaryl compounds are used.

Particularly preferred polycarbonates are the homopolycarbonate based on bisphenol A, the homopolycarbonate based on 1,1-bis(4-hydroxyphenyl)-3,3,5-trimethylcyclohexane and the copolycarbonates based on the two monomers bisphenol A and 1,1-bis(4-hydroxyphenyl)-3,3,5-trimethylcyclohexane or the two monomers bisphenol A and 4,4'-dihydroxydiphenyl, and homo- or copolycarbonates derived from the dihydroxyaryl compounds of the formulae (I), (II) and/or (III)

in which R' in each case is $C_1$- to $C_4$-alkyl, aralkyl or aryl,
preferably methyl or phenyl, most preferably methyl,
especially with bisphenol A.

The dihydroxyaryl compounds used, like all the other chemicals and auxiliaries added to the synthesis, may be contaminated with the impurities originating from their own synthesis, handling and storage. However, it is desirable to use raw materials of the highest possible purity.

Preference is also given to copolycarbonates having one or more monomer units of a siloxane of the general formula (IV)

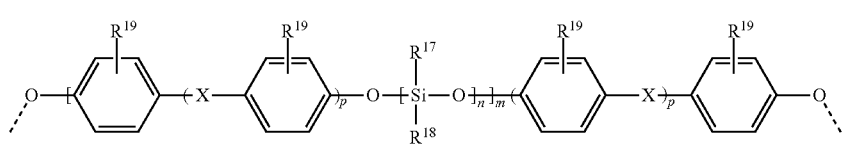

in which $R^{19}$ is hydrogen, Cl, Br or a $C_1$- to $C_4$-alkyl radical, preferably hydrogen or a methyl radical, more preferably hydrogen, $R^{17}$ and $R^{18}$ are the same or different and are each independently an aryl radical, a $C_1$- to $C_{10}$-alkyl radical or a $C_1$- to $C_{10}$-alkylaryl radical, preferably each a methyl radical, and where X is a single bond, —CO—, —O—, a $C_1$- to $C_6$-alkylene radical, a $C_2$- to $C_5$-alkylidene radical, a $C_5$- to $C_{12}$-cycloalkylidene radical or a $C_6$- to $C_{12}$-arylene radical which may optionally be fused to further aromatic rings containing heteroatoms, where X is preferably a single bond, a $C_1$- to $C_5$-alkylene radical, a $C_2$- to $C_5$-alkylidene radical, a $C_5$- to $C_{12}$-cycloalkylidene radical, —O— or —CO—, further preferably a single bond, an isopropylidene radical, a $C_5$- to $C_{12}$-cycloalkylidene radical or —O—, most preferably an isopropylidene radical, n is a number from 1 to 500, preferably from 10 to 400, more preferably from 10 to 100, most preferably from 20 to 60, m is a number from 1 to 10, preferably from 1 to 6, more preferably from 2 to 5, p is 0 or 1, preferably 1, and the value of n×m is preferably between 12 and 400, further preferably between 15 and 200, where the siloxane is preferably reacted with a polycarbonate in the presence of an organic or inorganic salt of a weak acid having a $pK_A$ of 3 to 7 (25° C.).

Copolycarbonates having monomer units of the formula (IV) and especially also the preparation thereof are described in WO 2015/052106 A2.

The total proportion of the monomer units based on the formulae (I), (II), (III), 4,4'-dihydroxydiphenyl and/or bisphenol TMC in the copolycarbonate is preferably 0.1-88 mol %, more preferably 1-86 mol %, even more preferably 5-84 mol % and especially 10-82 mol % (based on the sum total of the moles of dihydroxyaryl compounds used).

The copolycarbonates may be in the form of block and random copolycarbonate. Particular preference is given to random copolycarbonates.

The ratio of the frequency of the diphenoxide monomer units in the copolycarbonate is calculated here from the molar ratio of the dihydroxyaryl compounds used.

The relative solution viscosity of the copolycarbonates, determined to ISO 1628-4:1999, is preferably in the range of 1.15-1.35.

The monofunctional chain terminators required for molecular-weight regulation, for example phenols or alkylphenols, in particular phenol, p-tert-butylphenol, isooctylphenol, cumylphenol, chlorocarbonic esters thereof or acyl chlorides of monocarboxylic acids or mixtures of these chain terminators, are either supplied to the reaction with the bisphenolate(s) or else are added at any desired juncture in the synthesis provided that phosgene or chlorocarbonic acid end groups are still present in the reaction mixture or, in the case of acyl chlorides and chlorocarbonic esters as chain terminators, as long as sufficient phenolic end groups of the resulting polymer are available. However, it is preferable when the chain terminator(s) is/are added after the phosgenation at a location or at a juncture at which phosgene is no longer present but the catalyst has not yet been metered into the system or when they are metered into the system before the catalyst or together or in parallel with the catalyst.

Any branching agents or branching agent mixtures to be used are added to the synthesis in the same way, but typically before the chain terminators. Typically, trisphenols, quaterphenols or acid chlorides of tri- or tetracarboxylic acids are used, or else mixtures of the polyphenols or the acid chlorides.

Some of the compounds having three or more than three phenolic hydroxyl groups that are usable as branching agents are, for example, phloroglucinol, 4,6-dimethyl-2,4,6-tri(4-hydroxyphenyl)hept-2-ene, 4,6-dimethyl-2,4,6-tri(4-hydroxyphenyl)heptane, 1,3,5-tris(4-hydroxyphenyl)benzene, 1,1,1-tri(4-hydroxyphenyl)ethane, tris(4-hydroxyphenyl)phenylmethane, 2,2-bis[4,4-bis(4-hydroxyphenyl)cyclohexyl]propane, 2,4-bis(4-hydroxyphenylisopropyl)phenol, tetra(4-hydroxyphenyl)methane.

Some of the other trifunctional compounds are 2,4-dihydroxybenzoic acid, trimesic acid, cyanuric chloride and 3,3-bis(3-methyl-4-hydroxyphenyl)-2-oxo-2,3-dihydroindole.

Preferred branching agents are 3,3-bis(3-methyl-4-hydroxyphenyl)-2-oxo-2,3-dihydroindole and 1,1,1-tri(4-hydroxyphenyl)ethane.

The amount of any branching agents to be used is 0.05 mol % to 2 mol %, again based on moles of diphenols used in each case.

The branching agents may either be included together with the diphenols and the chain terminators in the initially charged aqueous alkaline phase or be added dissolved in an organic solvent before the phosgenation.

All these measures for preparation of the polycarbonates are familiar to those skilled in the art.

Aromatic dicarboxylic acids suitable for the preparation of the polyestercarbonates are, for example, orthophthalic acid, terephthalic acid, isophthalic acid, tert-butylisophthalic acid, 3,3'-diphenyldicarboxylic acid, 4,4'-diphenyldicarboxylic acid, 4,4-benzophenonedicarboxylic acid, 3,4'-benzophenonedicarboxylic acid, 4,4'-diphenyl ether dicarboxylic acid, 4,4'-diphenyl sulfone dicarboxylic acid, 2,2-bis(4-carboxyphenyl)propane, trimethyl-3-phenylindane-4,5'-dicarboxylic acid.

Among the aromatic dicarboxylic acids, particular preference is given to using terephthalic acid and/or isophthalic acid.

Derivatives of the dicarboxylic acids are the dicarbonyl halides and the dialkyl dicarboxylates, especially the dicarbonyl chlorides and the dimethyl dicarboxylates.

The carbonate groups are replaced essentially stoichiometrically and also quantitatively by the aromatic dicarboxylic ester groups, and so the molar ratio of the coreactants is also reflected in the finished polyester carbonate. The aromatic dicarboxylic ester groups can be incorporated either randomly or in blocks.

Preferred modes of preparation of the polycarbonates for use in accordance with the invention, including the polyestercarbonates, are the known interfacial process and the known melt transesterification process (cf. e.g. WO 2004/063249 A1, WO 2001/05866 A1, U.S. Pat. Nos. 5,340,905 A, 5,097,002 A, 5,717,057 A).

In the former case the acid derivatives used are preferably phosgene and optionally dicarbonyl chlorides, and in the latter case preferably diphenyl carbonate and optionally dicarboxylic esters. Catalysts, solvents, workup, reaction conditions etc. for polycarbonate production/polyestercarbonate production are in both cases sufficiently described and known.

Compositions in the context of the invention are preferably "polycarbonate compositions" or else "polycarbonate-based compositions". These are those compositions wherein the base material, i.e. predominant component present, is a polycarbonate. "Predominant" here means at least 60% by weight, preferably at least 68% by weight, more preferably at least 70% by weight, especially preferably at least 74% by weight, of aromatic polycarbonate, based on the overall composition.

Component B

According to the invention, sized or unsized talc is used as component B). According to the invention, unsized talc is that which does not include any size before being mixed with a further component. The use of PMMI copolymers is preferred especially in the case of compositions in which unsized talc is used.

Talc in the context of the present invention is preferably a talc of essentially the same chemical composition, particle diameter, porosity and/or BET surface area, or a talc mixture.

Talc is generally a sheet silicate. It can be described as magnesium silicate hydrate having the general chemical composition $Mg_3[Si_4O_{10}(OH)_2]$. However, different types of talc contain different impurities, and so there may be deviations from this general composition.

The talc may include a size in order to improve compatibility with the polymer. In the context of the present invention, a size is considered to be a controlled (chemi- or physisorbed) enrichment of molecules other than talc, especially $Mg_3[Si_4O_{10}(OH)_2]$, at the surface. Unsized talc is thus non-surface-treated talc, meaning that, after the talc particles having the desired particle diameter have been recovered and optionally subjected to compaction, the talc preferably has not been subjected to any further process step that alters the surface of the talc in a controlled manner by chemisorption or physisorption. However, this does not rule out the unintentional arrival of impurities, dust or similar particles on parts of the surface during the further handling of the talc, provided that the surface of the talc does not lose its properties to any significant degree, especially in relation to the pH.

Preferably, the talc has a pH of 8 to 10, more preferably 8.5 to 9.8, even more preferably 9.0 to 9.7, where the pH is determined according to EN ISO 787-9:1995. It should be noted that EN ISO 787-9:1995 also mentions the option of addition of ethanol or other organic solvents to improve the dispersion of the solids to be analysed. Preference is given in accordance with the invention to using distilled water only for determination of the pH according to EN ISO 787-9:1995.

Component B) preferably has an iron(II) oxide and/or iron(III) oxide content of 0.2% to 2.5% by weight, more preferably 0.3% to 2.3% by weight, most preferably from 0.3% to 2.0% by weight. This content is preferably measured by x-ray fluorescence or atomic absorption spectroscopy. It has been found that the iron oxide content in the talc has an influence on the degree of degradation of the polycarbonate. Within the range of iron oxide contents specified in accordance with the invention, particularly good results have been achieved in relation to the reduction in the degradation of the polycarbonate.

Likewise preferably, component B) has an aluminium oxide content of 0.01% to 0.5% by weight, more preferably of 0.05% to 0.48% by weight, most preferably from 0.15% to 0.45% by weight.

Component B) preferably has a median particle diameter $D_{50}$ of 0.01 to 9.5 μm, more preferably 0.25 to 8.00 μm, further preferably 0.5 to 6.00 μm and most preferably 0.6 μm to not more than 3.0 μm, where the particle diameter $D_{50}$ is determined by sedimentation analysis. The median $D_{50}$ is understood by the person skilled in the art to mean a mean particle diameter at which 50% of the particles are smaller than the defined value. Preferably, the particle diameter $D_{50}$ is determined according to ISO13317-3:2001.

Component B) preferably has a BET surface area of 7.5 to 20.0 $m^2/g$, more preferably of 9.0 to 15.0 $m^2/g$, most preferably 9.5 to 14.0 $m^2/g$. The determination of the surface area according to Brunauer, Emmett and Teller by means of gas adsorption is known per se to those skilled in the art. Preferably, the BET surface area is determined according to ISO 4652:2012. This preferred BET surface area is more preferably linked to the above-described median particle diameter $D_{50}$ of the talc.

More preferably, the talc has a content of ≥96% by weight, more preferably ≥97% by weight, most preferably ≥98% by weight.

It is likewise preferable that the talc has an ignition loss at 1050° C. of 5.0% to 7.0% by weight, more preferably of 5.2 to 6.5% by weight and most preferably of 5.3 to 6.2% by weight. The ignition loss is preferably determined by means of DIN51081:2002.

The talc or talc mixture of component B) is preferably in compacted form.

Component C

Component C is PMMI copolymers. These are thermoplastics that are partly imidated methacrylic polymers. PMMI copolymers are especially obtained by reaction of PMMA with methylamine in dispersion or in the melt in a reactor. A suitable process is described, for example, in DE 1 077 872 A1. Imide structures are produced here along the polymer chain, with formation, depending on the degree of reaction, also of methacrylic anhydride and free methacrylic acid functionalities. The proportion of imide functionalities in the copolymer determines the heat distortion resistance thereof. The degree of conversion is controllable.

PMMI copolymers have methacrylate (MMA, 4a), methylmethacrylimide (MMI, 6), methylmethacrylic acid (MMS, 4b) and methylmethacrylic anhydride units (MMAH, 5). Preferably at least 90%, more preferably at least 95%, by weight of the PMMI copolymer, based on the total weight of the PMMI copolymer, is MMA, MMI, MMS and MMAH units. More preferably, the PMMI copolymers consist of these units.

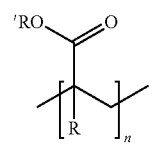

4

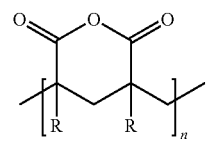

5

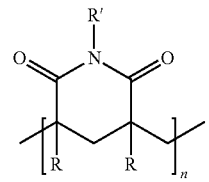

6

MMA: 4a (R=R'=CH₃), MMS: 4b (R=CH₃, R'=H), MMAH: 5 (R=CH₃), MMI: 6 (R=R'=CH₃).

The units and their proportions in the PMMI copolymer can especially be determined by means of quantitative $^1$H NMR spectroscopy, on the basis of a clear chemical shift of the R' signals. The assignment of the signals of the acid and anhydride monomer units is not unambiguously possible, and therefore a collective consideration of these units is advisable.

The PMMI copolymer preferably has an MMI content of at least 30% by weight, preferably of at least 35% by weight, more preferably of 35% to 96% by weight, especially preferably of 36% to 95% by weight, of MMI, based on the total weight of the PMMI copolymer.

The MMA content of the copolymer is preferably 3% to 65% by weight, preferably 4% to 60% by weight, especially preferably 4.0% to 55% by weight, based on the total weight of the PMMI copolymer.

The proportion of MMS and MMAH in total is preferably up to 15% by weight, further preferably up to 12% by weight, more preferably 0.5% to 12% by weight, based on the total weight of the PMMI copolymer.

The acid number of the PMMI copolymers, determined according to DIN 53240-1:2013-06, is preferably 15 to 50 mg KOH/g, more preferably 20 to 45 mg KOH/g, even more preferably 22 to 42 mg KOH/g.

A very particularly preferred PMMI copolymer has an MMI content of 36.8% by weight, an MMA content of 51.7% by weight and an MMS+MMAH content of 11.5% by weight, based in each case on the total weight of the PMMI copolymer, determined by means of $^1$H NMR spectroscopy, and an acid number of 22.5 mg KOH/g, determined according to DIN 53240-1:2013-06.

An alternatively very particularly preferred PMMI copolymer has an MMI content of 83.1% by weight, an MMA content of 13.6% by weight and an MMS+MMAH content of 3.3% by weight, based in each case on the total weight of the PMMI copolymer, determined by means of $^1$H NMR spectroscopy, and an acid number of 22.5 mg KOH/g, determined according to DIN 53240-1:2013-06.

A likewise alternatively very particularly preferred PMMI copolymer has an MMI content of 94.8% by weight, an MMA content of 4.6% by weight and an MMS+MMAH content of 0.6% by weight, based in each case on the total weight of the PMMI copolymer, determined by means of $^1$H NMR spectroscopy, and an acid number of 41.5 mg KOH/g, determined according to DIN 53240-1:2013-06.

Suitable PMMI is available, for example, from Evonik Industries AG under the "PLEXIMID®" brand.

In the talc-containing polycarbonate compositions, the amount added for the PMMI copolymer is preferably at least 1.5% by weight, more preferably at least 2% by weight, even more preferably at least 3% by weight, especially preferably 4% by weight, very especially preferably up to 6% by weight, based in each case on the total weight of the polycarbonate composition.

The glass transition temperature of the PMMI copolymer is preferably 130 to 170° C. Thus, the PMMI copolymer is stable under the processing conditions that are customary for polycarbonate—including those customary for polycarbonate copolymers of high thermal stability.

Component D

The compositions according to the invention may comprise one or more further additives referred to collectively in the present context as "component D".

The additives are optionally present (0% by weight) in the composition according to the invention by up to 20% by weight, more preferably up to 10.0% by weight, even more preferably to an extent of 0.10% to 8.0% by weight, especially preferably to an extent of 0.2% to 3.0% by weight, where these percentages by weight are based on the total weight of the composition.

Those additives as typically added in the case of polycarbonates are described, for example, in EP 0 839 623 A1, WO 96/15102 A2, EP 0 500 496 A1 or in "Plastics Additives Handbook", Hans Zweifel, 5th Edition 2000, Hamer Verlag, Munich. Suitable additives are especially flame retardants, anti-dripping agents, impact modifiers, fillers other than component B, antistats, organic and inorganic colourants including pigments and carbon black, lubricants and/or demoulding agents, thermal stabilizers, blending partners such as ABS, polyesters, e.g. PET and/or PBT, or SAN, compatibilizers, UV absorbers and/or IR absorbers.

Preferred demoulding agents are esters of aliphatic long-chain carboxylic acids with mono- or polyhydric aliphatic and/or aromatic hydroxyl compounds. Particular preference is given to pentaerythritol tetrastearate, glycerol monostearate, stearyl stearate and propanediol distearate, or mixtures thereof.

Preferred UV stabilizers have minimum transmittance below 400 nm and maximum transmittance above 400 nm. Ultraviolet absorbers particularly suitable for use in the composition according to the invention are benzotriazoles, triazines, benzophenones and/or arylated cyanoacrylates.

Particularly suitable ultraviolet absorbers are hydroxybenzotriazoles such as 2-(3',5'-bis(1,1-dimethylbenzyl)-2'-hydroxyphenyl)benzotriazole (Tinuvin® 234, Ciba Spezialitätenchemie, Basle), 2-(2'-hydroxy-5'-(tert-octyl)phenyl) benzotriazole (Tinuvin® 329, Ciba Spezialitätenchemie, Basle), 2-(2'-hydroxy-3'-(2-butyl)-5'-(tert-butyl)phenyl)benzotriazole (Tinuvin® 350, Ciba Spezialitätenchemie, Basle), bis(3-(2H-benzotriazolyl)-2-hydroxy-5-tert-octyl)methane, (Tinuvin® 360, Ciba Spezialitätenchemie, Basle), (2-(4,6-diphenyl-1,3,5-triazin-2-yl)-5-(hexyloxy)phenol (Tinuvin® 1577, Ciba Spezialitätenchemie, Basle), and the benzophenones 2,4-dihydroxybenzophenone (Chimassorb® 22, Ciba Spezialitätenchemie, Basle) and 2-hydroxy-4-(octyloxy) benzophenone (Chimassorb® 81, Ciba, Basle), 2-cyano-3, 3-diphenyl-2-propenoic acid 2-ethylhexyl ester, 2,2-bis[[(2-cyano-1-oxo-3,3-diphenyl-2-propenyl]oxylmethyl]-1,3-propanediyl ester (9CI) (Uvinul® 3030, BASF AG Ludwigshafen), 2-[2-hydroxy-4-(2-ethylhexyl)oxylphenyl-4,6-di(4-phenyl)phenyl-1,3,5-triazine (CGX UVA 006, Ciba Spezialitätenchemie, Basle) or tetraethyl 2,2'-(1,4-phenylenedimethylidene)bismalonate (Hostavin® B-Cap, Clariant AG).

Particularly preferred specific UV stabilizers are, for example, Tinuvin® 360, Tinuvin® 350, Tinuvin® 329, Hostavin® B-CAP, more preferably TIN 329 and Hostavin® B-Cap. It is also possible to use mixtures of these ultraviolet absorbers.

If UV absorbers are present, the composition preferably contains ultraviolet absorbers in an amount of 0 ppm to 6000 ppm, more preferably 500 ppm to 5000 ppm, even more preferably 1000 ppm to 2000 ppm, based on the overall composition.

Suitable IR absorbers are disclosed, for example, in EP 1 559 743 A1, EP 1 865 027 A1, DE 10022037 A1, DE 10006208 A1 and in Italian patent applications RM2010A000225, RM2010A000227 and RM2010A000228. Of the IR absorbers mentioned in the literature cited, preference is given to those based on boride and tungstate, especially caesium tungstate or zinc-doped caesium tungstate, and also ITO- and ATO-based absorbers and combinations thereof.

Suitable colourants may be pigments, organic and inorganic pigments, carbon black and/or dyes. Colourants or pigments in the context of the present invention are sulfur-containing pigments such as cadmium red or cadmium yellow, iron cyanide-based pigments such as Prussian blue, oxide pigments such as titanium dioxide, zinc oxide, red iron oxide, black iron oxide, chromium oxide, titanium yellow, zinc/iron-based brown, titanium/cobalt-based green, cobalt blue, copper/chromium-based black and copper/iron-based black or chromium-based pigments such as chromium yellow, phthalocyanine-derived dyes such as copper phthalocyanine blue or copper phthalocyanine green, fused polycyclic dyes and pigments such as azo-based (e.g. nickel azo yellow), sulfur indigo dyes, perinone-based, perylene-based, quinacridone-derived, dioxazine-based, isoindolinone-based and quinophthalone-derived derivatives, anthraquinone-based heterocyclic systems.

Specific examples of commercial products are, for example, MACROLEX® Blue RR, MACROLEX® Violet 3R, MACROLEX® Violet B (Lanxess AG, Germany), Sumiplast® Violet RR, Sumiplast® Violet B, Sumiplast® Blue OR (Sumitomo Chemical Co., Ltd.), Diaresin® Violet D, Diaresin® Blue G, Diaresin® Blue N (Mitsubishi Chemical Corporation), Heliogen® Blue or Heliogen® Green (BASF AG, Germany). Among these, preference is given to cyanine derivatives, quinoline derivatives, anthraquinone derivatives, phthalocyanine derivatives.

Fillers other than component B) may likewise be added, provided that they do not impair the level of properties of the present invention by their nature and amount. Useful materials in principle for this purpose include all finely ground organic and inorganic materials. These may, for example, be of particulate, flaky or fibrous character. Examples of these include chalk, quartz powder, titanium dioxide, silicates/aluminosilicates, for example wollastonite, mica/clay layered minerals, montmorillonite, especially also in an organophilic form modified by ion exchange, kaolin, zeolites, vermiculite, and also aluminium oxide, silica, glass fibres, carbon fibres, magnesium hydroxide and aluminium hydroxide. It is also possible to use mixtures of different inorganic materials. Useful inorganic fillers especially include titanium dioxide, generally in an amount of 0% to 2.5% by weight, based on the sum total of the overall composition, or barium sulfate.

In addition, it is possible to add further constituents which do not impair the level of properties of the present invention by the nature of the constituent and amount thereof.

Compositions preferred in accordance with the invention contain
A) at least 60% by weight of aromatic polycarbonate,
B) 5% to 35% by weight of talc,
C) 0.1% to 8% by weight of PMMI copolymer and
D) optionally further additives.

Further-preferred compositions according to the invention contain
A) at least 68% by weight of aromatic polycarbonate,
B) 10% to 30% by weight of talc,
C) 0.2% to 6% by weight of PMMI copolymer and
D) optionally further additives.

Even further-preferred compositions according to the invention consist of
A) at least 68% by weight of aromatic polycarbonate,
B) 10% to 30% by weight of talc,
C) 0.2% to 6% by weight of PMMI copolymer and
D) optionally one or more further additives selected from the group consisting of flame retardants, anti-dripping agents, impact modifiers, fillers other than component B, antistats, colourants, pigments, carbon black, lubricants and/or demoulding agents, thermal stabilizers, compatibilizers, UV absorbers and/or IR absorbers.

Very particularly preferred compositions according to the invention consist of
A) at least 68% by weight of aromatic polycarbonate,
B) 15% to 25% by weight of talc,
C) 1.5% by weight to 6% by weight, especially 4% to 6% by weight, of PMMI copolymer and
D) optionally up to 10.0% by weight of one or more further additives selected from the group consisting of flame retardants, anti-dripping agents, impact modifiers, fillers other than component B, antistats, colourants, pigments, carbon black, lubricants and/or demoulding agents, thermal stabilizers, compatibilizers, UV absorbers and/or IR absorbers.

In particular, the proportion here of methylmethacrylimide units is at least 30% by weight, the proportion of methyl methacrylate units 3% to 65% by weight, and the proportion of methylmethacrylic acid and methylmethacrylic anhydride units up to 15% by weight in total, based in each case on the total weight of the PMMI copolymer present in the composition, and the acid number, determined according to DIN 53240-1:2013-06, is 15 to 50 mg, most preferably 20 to 45 mg, KOH/g.

The production of the polymer compositions according to the invention, comprising the mixed components A), B), C) and optionally D) and optionally further constituents, can be effected using powder premixes. It is also possible to use premixes of pellets or pellets and powders with the additives according to the invention. It is also possible to use premixes which have been produced from solutions of the mix components in suitable solvents, in which case homogenization is optionally effected in solution and the solvent is then removed. More particularly, the additives referred to as component D and also further constituents of the compositions according to the invention can be introduced by known methods or in the form of a masterbatch. The use of masterbatches is especially preferred for introduction of additives and further constituents, in which case masterbatches based on the respective polymer matrix in particular are used.

The compositions according to the invention can be extruded, for example. After extrusion, the extrudate can be chilled and comminuted. The combining and commixing of a pre-mix in the melt can also be effected in the plastifying unit of an injection moulding machine. In this case, the melt is directly converted to a molded article in the subsequent step.

It has especially been found that the compositions according to the invention are particularly suitable for the production of extrudates, preferably for the extrusion of profiles and sheets.

Owing to the elevated thermal conductivity, preference is given to use of the talc-filled polycarbonate compositions, for example, as cooling bodies (heatsinks) in lampholders or for other electronic components.

In addition, use of the compositions as housing material in the electric/electronic sector, for instance for electric meters, mobile electronic devices (mobile phones, laptops, tablets, etc.) is also possible, and likewise for TV housings, and as material, especially as housing material, for domestic appliances (vacuum cleaners, air conditioning units, shavers, etc.).

The compositions according to the invention are also suitable for applications that require high surface quality, for example in optical applications, for instance for reflectors.

In polycarbonate compositions that have to have particular flame retardancy properties, talc is sometimes used as additive in order to improve fire characteristics. Here too, it is necessary to use a suitable talc stabilizer.

The compositions according to the invention are also suitable as matrix material for composite production.

Stabilization by means of PMMI copolymer of polycarbonate compositions is preferred especially where there are high dwell times, i.e. dwell times of several minutes, i.e., for example, in the case of co-kneaders.

EXAMPLES

Polymers:

PC: A commercially available polycarbonate based on bisphenol A, having an MVR of 19 cm$^3$/10 min (300° C./1.2 kg, ISO 1133-1:2011) and a softening temperature (VST/B 120; ISO 306:2013) of 145° C. (Makrolon® 2408 from Covestro Deutschland AG). $M_w$, determined as described below, about 23 900 g/mol.

Stabilizers:

PMMI1: Poly(N-methylmethacrylimide) copolymer from Evonik (Pleximid® 8803) having a softening temperature (VST/B 50; ISO 306:2013) of 130° C. Acid number: 22.5 mg KOH/g, determined to DIN 53240-1 (June 2013). Proportion of MMI (methylmethacrylimide): 36.8% by weight, proportion of MMA (methyl methacrylate): 51.7% by weight, proportion of MMS (methylmethacrylic acid)+MMAH (methylmethacrylic anhydride): 11.5% by weight, based in each case on the total weight of the PMMI and determined by means of quantitative $^1$H NMR spectroscopy.

PMMI2: Poly(N-methylmethacrylimide) copolymer from Evonik (Pleximid® TT50) having a softening temperature (VST/B 50; ISO 306:2013) of 150° C. Acid number: 22.5 mg KOH/g, determined to DIN 53240-1 (June 2013). Proportion of MMI: 83.1% by weight, proportion of MMA: 13.6% by weight, proportion of MMS (methylmethacrylic acid)+MMAH: 3.3% by weight, based in each case on the total weight of the PMMI and determined by means of quantitative $^1$H NMR spectroscopy.

PMMI3: Poly(N-methylmethacrylimide) copolymer from Evonik (Pleximid® TT70) having a softening temperature (VST/B 50; ISO 306:2013) of 170° C. Acid number: 41.5 mg KOH/g, determined to DIN 53240-1 (June 2013). Proportion of MMI: 94.8% by weight, proportion of MMA: 4.6% by weight, proportion of MMS+MMAH: 0.6% by weight, based in each case on the total weight of the PMMI and determined by means of quantitative $^1$H NMR spectroscopy.

Stab1: An acid-modified ethylene wax from Mitsui Chemical America, Inc. (Hiwax™ 1105 A) having an average molecular weight (gel permeation chromatography in ortho-dichlorobenzene at 150° C. with polystyrene calibration) $M_w$=6301 g/mol, $M_n$=1159 g/mol and with an acid number of 52.6 mg KOH/g (test method JIS K0070). Maleic anhydride content: 4.4% by weight, based on the total weight of the terpolymer.

Stab2: A maleic anhydride-modified polypropylene copolymer from Honeywell (AC907P) having an average molecular weight (gel permeation chromatography in ortho-dichlorobenzene at 150° C. with polystyrene calibration) $M_w$=20 700 g/mol, $M_n$=1460 g/mol and with an acid number of 78 mg KOH/g (ASTM D-1386)).

Fillers:

Talc: A compacted talc from IMI Fabi having a talc content of 99% by weight, an iron oxide content of 0.4% by weight, an aluminium oxide content of 0.4% by weight, ignition loss of 6.0% by weight, $D_{50}$ (sedimentation analysis, Sedigraph5120) of 0.65 µm; BET surface area 13.5 m$^2$/g, density (determined to DIN53193) of 2.8 g/cm$^3$ (HTPultra5C).

Production Parameters:

The extruder used was a DSM Micro-Extruder MIDI 2000 having a capacity of 15 cm$^3$. The melt temperature in the extruder was 290° C., the speed was 150 rpm, and the dwell time (DT) was 5 minutes or 10 minutes. A DSM injection moulding machine was used for the injection moulding. The melt temperature in the injection moulding was: 300° C., the mould temperature 80° C.

Methods of Determination:

$M_w$: Gel permeation chromatography, calibrated against bisphenol A polycarbonate standards, using dichloromethane as eluent. Calibration with linear polycarbonates (formed from bisphenol A and phosgene) of known molar mass distribution from PSS Polymer Standards Service GmbH, Germany, calibration by method 2301-0257502-09D (from 2009 in German language) from Currenta GmbH & Co. OHG, Leverkusen. The eluent is dichloromethane. Column combination of crosslinked styrene-divinylbenzene resins. Diameter of analytical columns: 7.5 mm; length: 300 mm. Particle sizes of column material: 3 µm to 20 µm. Concentration of solutions: 0.2% by weight. Flow rate: 1.0 ml/min, temperature of solutions: 30° C. Injection volume; 100 µl. Detection by means of UV detector.

Yellowness Index (Y.I.) was measured according to ASTM E313-10. Transmission values (Ty) were determined according to ASTM-E-308. Both Y.I. and Ty were evaluated as D65, 10° (illuminant: D65/observer:10°). The samples analysed had a geometry of 6.0 mm×3.5 mm×1.5 mm.

The viscosity of the polymer melts was measured according to ISO 11443:2005 at a melt temperature of 300° C.

The Vicat softening temperature (VST/B/50) of the compositions was measured on test specimens according to ISO 306:2013.

The tensile modulus and tensile strength of the compositions were measured on test specimens according to ISO 527-1:2012.

The penetration force and penetration deformation of the compositions were measured on test specimens according to ISO 6603-2:2000.

Results:

EXAMPLES

TABLE 1

Talc-free polycarbonate and the effect of PMMI

|  | DT [min] | 1C % by wt. | 2C % by wt. | 3C % by wt. | 4C % by wt. | 5C % by wt. | 6C % by wt. | 7C % by wt. |
|---|---|---|---|---|---|---|---|---|
| PC |  | 100 | 99.8 | 99.5 | 99 | 98 | 96 | 94 |
| PMMI1 |  |  | 0.2 | 0.5 | 1 | 2 | 4 | 6 |
| $M_w$ [g/mol] | 5 | 23365 | 23408 | 23395 | 23409 | 23493 | 23554 | 23689 |
| Y.I. | 5 | 3.69 | 3.21 | 6.35 | 12.75 | 18.70 | 26.53 | 29.27 |
| (D65, 10°) | 10 | 4.01 | 3.49 | 7.57 | 14.41 | 19.25 | 30.29 | 32.57 |
| Δ Y.I. |  | 0.32 | 0.27 | 1.21 | 1.66 | 0.56 | 3.76 | 3.30 |

In unfilled polycarbonate, there is essentially no degradation of the polymer chains. Therefore, no stabilizer is required. As apparent from Table 1, the addition of PMMI to filler-free polycarbonate does not have any adverse effect on the molar mass. The average molar masses are at a constant level within the scope of measurement accuracy. As can be seen in Table 1, the optical properties (Y.I.) and colour stability (ΔY.I. (5 min/10 min)) decrease with rising PMMI copolymer content. However, if these values are compared with the compositions in Table 4 that contain Stab 1 and Stab 2 (Examples 20C and 21C), yellowing with PMMI is significantly less marked. Moreover, both Stab1 and Stab2 lead to a significant reduction in transmission in unfilled polycarbonate.

extreme case under real process conditions. This means that these present results can also show that good stabilization is achievable especially also for extruders with high dwell times, for instance co-kneaders. First of all, the addition of PMMI to talc-filled polycarbonate always leads to an increase in the Y.I. value and to a deterioration in optical properties. It is surprising that, however, unlike in unfilled systems, a considerable decline in Y.I. values can be observed here in the plateau region beginning from about 3% by weight, preferably from about 4% by weight (see Examples 13 and 14 in Table 2), and this leads to acceptable Y.I. values comparable with those for unfilled polycarbonate with the shorter residence time of 5 min.

TABLE 2

Talc-containing polycarbonate compositions and the effect of PMMI

|  | DT [min] | 8C % by wt. | 9 % by wt. | 10 % by wt. | 11 % by wt. | 12 % by wt. | 13 % by wt. | 14 % by wt. |
|---|---|---|---|---|---|---|---|---|
| PC |  | 80 | 79.8 | 79.5 | 79 | 78 | 76 | 74 |
| Talc |  | 20 | 20 | 20 | 20 | 20 | 20 | 20 |
| PMMI1 |  |  | 0.2 | 0.5 | 1 | 2 | 4 | 6 |
| $M_w$ [g/mol] | 5 | 15410 | 18328 | 19429 | 18596 | 20175 | 21731 | 21980 |
| Y.I. | 5 | 20.72 | 22.98 | 32.62 | 41.70 | 49.14 | 4.60 | 6.46 |
| (D65, 10°) | 10 | 36.71 | 35.91 | 38.87 | 46.32 | 39.50 | 11.58 | 10.13 |
| Δ Y.I. |  | 15.99 | 12.93 | 6.25 | 4.62 | −9.64 | 6.98 | 3.67 |

If talc-containing polycarbonate compositions are considered, distinct differences are apparent compared to talc-free polycarbonate compositions. The addition of talc leads, even after a dwell time of 5 minutes, to a considerable decrease in molecular weight ($M_w$) of the polymer from about 23 900 g/mol to about 15 000 g/mol. With increasing PMMI content, however, polymer degradation can be distinctly reduced. With 2% by weight of added PMMI (based on the overall composition), the effect is already attractive. With about 4-6% by weight of added PMMI, an optimum has been attained (see also Examples 30-33 in Table 5). A decrease in molecular weight cannot be completely avoided by the addition of PMMI in economically attractive amounts, but can be brought to a level that means such a small decrease in molecular weight that it is negligible. It should additionally be taken into account that a dwell time of 5 minutes at elevated temperature constitutes more of an

TABLE 3

Talc-containing polycarbonate compositions and the effect of different types of PMMI

|  | DT [min] | 15C % by wt. | 16 % by wt. | 17 % by wt. | 18 % by wt. |
|---|---|---|---|---|---|
| PC |  | 80 | 79 | 79 | 79 |
| Talc |  | 20 | 20 | 20 | 20 |
| PMMI1 |  |  | 1 |  |  |
| PMMI2 |  |  |  | 1 |  |
| PMMI3 |  |  |  |  | 1 |
| $M_w$ [g/mol] | 5 | 15410 | 18596 | 19730 | 19906 |
| Y.I. | 5 | 20.72 | 41.70 | 32.35 | 26.51 |
| (D65, 10°) | 10 | 36.71 | 46.32 | 39.31 | 39.53 |
| Δ Y.I. |  | 16.00 | 4.62 | 6.96 | 13.02 |

The PMMI types used differ in their content of MMI, MMA, acid and anhydride.

Surprisingly, what was found for talc-filled polycarbonate was not, as expected, that the PMMI having the lowest content of MMI (PMMI1) leads to the best compatibility—smallest decrease in molar mass, and also the least yellowing—but rather the PMMI having the highest MMI content and simultaneously lowest acid content (PMMI3). The measurements of the Y.I. values after a dwell time of 5 minutes show that yellowing is also reduced with rising MMI content (PMMI1<PMMI2<PMMI3). However, a comparison of the ΔY.I. values between dwell times of 5 and 10 minutes shows that the degree of yellowing increases more significantly with rising MMI content for shorter and longer dwell times compared to one another. Even though the starting Y.I. level of talc-filled polycarbonate without PMMI is the lowest, the difference between a dwell time of 5 minutes and 10 minutes is at its greatest (ΔY.I.=16). It can be concluded from this that the colour stability of PMMI copolymer+talc+PC systems depends on the MMI content and the duration of thermal stress on the material.

TABLE 4

Comparison of different acids/maleic anhydride-functionalized copolymers as stabilizers

| | DT [min] | 19C % by wt. | 20C % by wt. | 21C % by wt. | 22 % by wt. | 23 % by wt. | 24 % by wt. |
|---|---|---|---|---|---|---|---|
| PC | | 99 | 99 | 99 | 79 | 79 | 79 |
| Talc | | | | | 20 | 20 | 20 |
| PMMI1 | | 1 | | | 1 | | |
| Stab1 | | | 1 | | | 1 | |
| Stab2 | | | | 1 | | | 1 |
| $M_w$ [g/mol] | 5 | 23409 | 23382 | 23104 | 18596 | 20816 | 22157 |
| Y.I. | 5 | 12.75 | 22.98 | 16.55 | 41.70 | 35.51 | 27.17 |
| (D65, 10°) | 10 | 14.41 | 29.53 | 25.70 | 46.32 | 54.72 | 46.49 |
| Δ Y.I. | | 1.66 | 6.55 | 9.15 | 4.62 | 19.21 | 19.32 |
| Ty (%) | | 80.87 | 48.25 | 61.77 | — | — | — |

In combination with talc and 1% by weight in each case of additive, Stab2 shows the best stabilization, especially in the case of a prolonged dwell time, but the adverse effect on optical properties is manifested here. The compositions to which Stab1 and Stab2 have been added have a tendency to much more intense yellowing (greater Δ Y.I.). The compositions comprising the polyolefinic copolymers, even at 1% by weight in unfilled PC, also have a distinct reduction in transmission that has an adverse effect on colourability.

TABLE 5

Comparison of different filler/additive ratios

| | DT [min] | 25 % by wt. | 26 % by wt. | 27 % by wt. | 28 % by wt. | 29 % by wt. | 30 % by wt. | 31 % by wt. |
|---|---|---|---|---|---|---|---|---|
| PC | | 89 | 87.5 | 85 | 79.5 | 78 | 76 | 75 |
| Talc | | 10 | 10 | 10 | 20 | 20 | 20 | 20 |
| PMMI1 | | 1 | 2.5 | 5 | 0.5 | 2 | 4 | 5 |
| PMMI1/talc | | 0.1 | 0.25 | 0.5 | 0.025 | 0.1 | 0.2 | 0.25 |
| $M_w$ [g/mol] | 5 | 22465 | 22678 | 22915 | 19429 | 20175 | 21731 | 22270 |

| | DT [min] | 32 % by wt. | 33 % by wt. | 34 % by wt. | 35 % by wt. | 36 % by wt. |
|---|---|---|---|---|---|---|
| PC | | 74 | 72 | 67 | 65 | 62.5 |
| Talc | | 20 | 20 | 30 | 30 | 30 |
| PMMI1 | | 6 | 8 | 3 | 5 | 7.5 |
| PMMI1/talc | | 0.3 | 0.4 | 0.1 | 0.16 | 0.25 |
| $M_w$ [g/mol] | 5 | 21980 | 22400 | 21136 | 20924 | 21038 |

At filler contents of 10% or 20% by weight, the stabilizing effect of PMMI1 increases with rising PMMI copolymer content. This increase is particularly marked at 20% by weight. At 30% by weight of talc, however, stabilization in the range from 3% to 7.5% by weight of PMMI copolymer examined seems to remain at a constantly good level irrespective of the PMMI copolymer content. Conditions preferred in accordance with the invention therefore exist especially when the proportion of talc is 15% to 25% by weight and the ratio of PMMI copolymer to talc is 0.1 to 0.6, especially 0.2 to 0.5.

TABLE 6

| Measurement of material properties on stabilized compounds[1] | | | | | | |
|---|---|---|---|---|---|---|
| | 37 % by wt. | 38 % by wt. | 39 % by wt. | 40 % by wt. | 41 % by wt. | 42 % by wt. |
| PC | 80 | 79 | 78 | 76 | 74 | 72 |
| Talc | 20 | 20 | 20 | 20 | 20 | 20 |
| PMMI1 | | 1 | 2 | 4 | 6 | 8 |
| Stab1 | | | | | | |
| Viscosity [Pa · s][2] | 58 | 176 | 213 | 216 | 209 | 209 |
| Vicat temperature [° C.] (Method B, 50 K/h) | 140.1 | 141.6 | 143.3 | 143.5 | 144.2 | 145 |
| Tensile modulus [MPa] | 4520 | 4904 | 4932 | 4880 | 4946 | 5085 |
| Tensile strength [MPa] | 59.4 | 70.1 | 70.3 | 70.8 | 71.2 | 72.1 |
| Penetration, maximum force [N] | 385 | 3140 | 4225 | 4179 | 4098 | 3206 |
| Penetration, deformation [mm] | 4.3 | 8.7 | 11.7 | 11.2 | 10.8 | 9.1 |
| $M_w$ [g/mol][3] | 17604 | 22614 | 23053 | 23420 | 23638 | 23816 |

| | 43 % by wt. | 44 % by wt. | 45 % by wt. |
|---|---|---|---|
| PC | 79 | 78 | 76 |
| Talc | 20 | 20 | 20 |
| PMMI1 | | | |
| Stab1 | 1 | 2 | 4 |
| Viscosity [Pa · s][2] | 159 | 156 | 102 |
| Vicat temperature [° C.] (Method B, 50 K/h) | 142.5 | 144.1 | 142.4 |
| Tensile modulus [MPa] | 4510 | 4248 | 4175 |
| Tensile strength [MPa] | 57.4 | 53.7 | 51.2 |
| Penetration, maximum force [N] | 4144 | 3885 | 1495 |
| Penetration, deformation [mm] | 14.1 | 13.9 | 10.6 |
| $M_w$ [g/mol][3] | 23229 | 23876 | 24038 |

[1]The compositions were produced on a twin-screw extruder (ZE 25 AX 40D-UTX, speed 100 rpm, throughput 10 kg/h, melt temperature 300° C.) from Berstorff. The talc was added by means of a side extruder (at about half the length of the processing unit).
[2]Melt viscosity was measured at 300° C. and a shear rate of 1000 s$^{-1}$ in accordance with ISO 11443:2005.
[3]The dwell time of the polycarbonate-talc mixture in the extruder was about 25 seconds (measured from addition of the talc via side extruder).

The tensile modulus of the material increases with increasing PMMI1 content. There is likewise an increase in the tensile strength, and hence the interaction between filler and polymer matrix. It is likewise possible to increase heat distortion resistance, measured here using the Vicat softening temperature, with rising PMMI1 content. This is firstly because of the more efficient stabilization of the filler and thus reduced degradation of the polymer matrix. Secondly, the viscosity of the composition increases as a result of the higher viscosity of the additive itself. By comparison, there is a decrease both in the tensile modulus and in the tensile strength with increasing Stab1 content. Above 2% by weight, the plasticizing effect of the polyolefinic copolymer is manifested, particularly in the mechanical properties of the compounds. This is also reflected in the decreasing viscosity with rising wax content (Stab1). The rising wax content is manifested by increased delamination in injection moulding (Examples 43-45), which is not as marked in the case of use of PMMI1 (Examples 38-42). As shown in Table 6, the trend of stabilization by addition of PMMI can also be followed in a standard extruder. As a result of the significantly shorter dwell time of about 25 seconds, the absolute values are above the measurements from the previous test series. The optimum here too is above 1% by weight of PMMI1.

If the results of the penetration test are compared, an optimum with regard to energy input and maximum deformation has been attained at 2% by weight to 6% by weight of PMMI1, based on the finished composition. Tensile modulus and Vicat temperature are high, molecular weight degradation is low, and the mixtures are homogeneous without any delamination at the surface.

If the results from Tables 5 and 6 are compared, the polycarbonate with 20% by weight of talc is sufficiently stabilized (measured by the molecular weight) when 5-8% by weight of PMMI1 is added. Within this range, the material additionally has distinctly elevated heat distortion resistance and improved mechanical properties.

The invention claimed is:
1. A composition comprising
A) at least 60% by weight of aromatic polycarbonate,
B) 5% to 35% by weight talc,
C) 2% to 8% by weight of PMMI copolymer, wherein the PMMI copolymer has 4% to 55% by weight of methyl methacrylate units, at least 36% to 95% by weight of methylmethacrylimide units, a total of 0.5% to 12%% by weight of methylmethacrylic acid units and methylmethacrylic anhydride units, based in each case on the total weight of the PMMI copolymer, and an acid number, determined according to DIN 53240-1:2013-06, of 15 to 50 mg KOH/g, and D) optionally further additives.

2. A composition comprising
A) at least 60% by weight of aromatic polycarbonate,
B) 5% to 30% by weight talc,
C) 2% to 8% by weight of PMMI copolymer, wherein the PMMI copolymer has 4% to 55% by weight of methyl methacrylate units, at least 36% to 95% by weight of methylmethacrylimide units, a total of 0.5% to 12%% by weight of methylmethacrylic acid units and methylmethacrylic anhydride units, based in each case on the total weight of the PMMI copolymer, and an acid number, determined according to DIN 53240-1:2013-06, of 15 to 50 mg KOH/g, and
D) optionally further additives.

3. The composition according to claim 2, consisting of
A) at least 68% by weight of aromatic polycarbonate,
B) 15% to 25% by weight of talc,
C) 2% to 6% by weight of PMMI copolymer and
D) optionally one or more further additives selected from the group consisting of flame retardants, anti-dripping agents, impact modifiers, fillers other than component B, antistats, colourants, pigments, carbon black, lubricants and/or demoulding agents, thermal stabilizers, blending partners, compatibilizers, UV absorbers and/or IR absorbers.

4. The composition according to claim 2, wherein the composition contains 15% to 25% by weight of talc.

5. The composition according to claim 2, wherein the acid number of the PMMI copolymer, determined to DIN 53240-1:2013-06, is 20 to 45 mg KOH/g.

6. The composition according to claim 2, wherein the proportion of talc is 15% to 25% by weight, based on the overall composition, and the ratio of PMMI copolymer to talc is 0.15 to 0.6.

7. The composition according to claim 2, wherein the proportion of PMMI copolymer in the finished composition is 2% to 6% by weight.

8. A moulding comprising the composition according to claim 2.

9. The moulding according to claim 8, wherein the moulding is a heat sink for electronic components, a housing or part of a housing from the electrics and electronics sector.

10. The composition according to claim 3, wherein the proportion of talc is 15% to 25% by weight, based on the overall composition, and the ratio of PMMI copolymer to talc is 0.2 to 0.5.

* * * * *